US010547328B1

(12) United States Patent
Li et al.

(10) Patent No.: US 10,547,328 B1
(45) Date of Patent: Jan. 28, 2020

(54) IMPLEMENTATION OF LLR BIASING METHOD IN NON-BINARY ITERATIVE DECODING

(71) Applicant: Marvell International Ltd., Hamilton (BM)

(72) Inventors: Shu Li, San Jose, CA (US); Yifei Zhang, Milpitas, CA (US); Wei Cao, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 662 days.

(21) Appl. No.: 14/546,850

(22) Filed: Nov. 18, 2014

Related U.S. Application Data

(63) Continuation of application No. 13/660,659, filed on Oct. 25, 2012, now Pat. No. 8,910,028.

(60) Provisional application No. 61/552,394, filed on Oct. 27, 2011.

(51) Int. Cl.
*H03M 13/11* (2006.01)
*H03M 13/23* (2006.01)

(52) U.S. Cl.
CPC .... *H03M 13/1128* (2013.01); *H03M 13/1125* (2013.01); *H03M 13/23* (2013.01)

(58) Field of Classification Search
CPC ............ H03M 13/41; H03M 13/4107; H03M 13/6502; H03M 13/3961; H03M 13/1128; H03M 13/1125; H03M 13/23; G11B 20/10009
USPC ........................................................ 714/795
See application file for complete search history.

(56) References Cited

U.S. PATENT DOCUMENTS

| | | | | |
|---|---|---|---|---|
| 6,487,694 B1* | 11/2002 | Bajwa | ............... | H03M 13/2957 714/786 |
| 6,697,441 B1* | 2/2004 | Bottomley | ........ | H03M 13/2957 375/324 |
| 7,027,500 B1* | 4/2006 | Casas | .................. | H04L 25/0307 348/607 |
| 7,904,793 B2* | 3/2011 | Mokhlesi | ............ | G11C 11/5642 714/780 |
| 7,975,209 B2* | 7/2011 | Chin | ................... | G06F 12/0246 375/262 |
| 8,255,765 B1 | 8/2012 | Yeo et al. | | |
| 8,290,102 B2* | 10/2012 | Kaynak | ............ | G11B 20/10009 327/551 |
| 8,910,028 B1* | 12/2014 | Li | ........................... | H04L 1/005 714/752 |
| 2002/0159546 A1* | 10/2002 | Fulghum | ........... | H03M 13/3738 375/341 |
| 2005/0278603 A1* | 12/2005 | Berens | .............. | H03M 13/2782 714/755 |
| 2007/0266274 A1 | 11/2007 | Lin | | |

(Continued)

*Primary Examiner* — Samir W Rizk
*Assistant Examiner* — Enam Ahmed

(57) ABSTRACT

Systems, methods, and apparatus are provided for iteratively decoding a codeword. Once a codeword is received, the codeword is processed to generate an incremental hard decision value and a log likelihood ratio amplitude value. These values are generated by processing the codeword using a soft output Viterbi algorithm. A faulty symbol in the codeword is identified. A complete hard decision value is generated using the incremental hard decision value. The LLR amplitude value and complete hard decision value corresponding to the identified faulty symbol are selectively provided to a decoder and the decoder uses these values to decode the codeword.

19 Claims, 7 Drawing Sheets

(56) References Cited

U.S. PATENT DOCUMENTS

| | | | |
|---|---|---|---|
| 2009/0045989 A1* | 2/2009 | Esumi | G11B 20/10009 341/58 |
| 2009/0150746 A1 | 6/2009 | Chaichanavong et al. | |
| 2010/0158085 A1* | 6/2010 | Khayrallah | H04L 25/03318 375/222 |
| 2011/0072335 A1* | 3/2011 | Liu | H03M 13/1102 714/796 |
| 2011/0085628 A1* | 4/2011 | Kaynak | G11B 20/10009 375/350 |
| 2011/0154156 A1 | 6/2011 | Li et al. | |

\* cited by examiner $$H = \begin{bmatrix} 1 & 0 & 0 & 1 & 0 & 0 & 1 & 0 & 0 \\ 0 & 1 & 0 & 0 & 1 & 0 & 0 & 1 & 0 \\ 0 & 0 & 1 & 0 & 0 & 1 & 0 & 0 & 1 \\ 1 & 0 & 0 & 0 & 0 & 1 & 0 & 1 & 0 \\ 0 & 1 & 0 & 1 & 0 & 0 & 0 & 0 & 1 \\ 0 & 0 & 1 & 0 & 1 & 0 & 1 & 0 & 0 \end{bmatrix} \begin{matrix} S_1 \\ S_2 \\ S_3 \\ S_4 \\ S_5 \\ S_6 \end{matrix}$$

FIG. 2A

IMPLEMENTATION OF LLR BIASING METHOD IN NON-BINARY ITERATIVE DECODING

CROSS-REFERENCE TO RELATED APPLICATIONS

This application is a continuation of U.S. patent application Ser. No. 13/660,659, filed Oct. 25, 2012 (now pending), which claims the benefit under 35 U.S.C. § 119(e) of U.S. Provisional Application No. 61/552,394, filed Oct. 27, 2011, each of which is hereby incorporated by reference herein in its entirety.

BACKGROUND OF THE DISCLOSURE

This disclosure relates generally to data decoding, and more particularly to iterative decoders for data encoded with a low-density parity check (LDPC) encoder.

An LDPC code is an error correcting code that is used in the transmission of information through a noisy communications channel, with or without memory. A variety of LDPC decoding techniques may be used to recover and correct the information received from the channel, most of which are iterative in nature.

In the case of a memoryless channel, an LDPC decoder directly receives log-likelihood-ratio (LLR) information, a bit reliability metric representative of the encoded data received from the channel, for use in the decoding operation. In the case of a channel with memory, a soft-in soft-out (SISO) channel detector, such as a soft output Viterbi algorithm (SOVA) detector, may be used in conjunction with the LDPC decoder. The decoding operation alternates between use of the SISO channel detector and the LDPC decoder in order to decode the data. In particular, LLR information is passed from the SISO channel detector to the LDPC decoder for use in the next LDPC decoding iteration and vice versa, in an iterative process that may be repeated, as desired, in order to improve data reliability.

Error correcting codes may be decoded using an iterative message passing process implemented by an iterative decoder. For example, a min-sum or sum-product decoding algorithm may be used to decode an LDPC code.

The iterative message passing algorithm used by the iterative decoder may occasionally fail to converge or may converge to an incorrect state, leading to bit-errors or sector-errors that generally degrade application performance. Such errors occur when the iterative message passing algorithm incorrectly converges to an errant vector (sometimes known as a near-codeword error) and/or when the algorithms fails to converge to any stable decoding state.

Certain deeply biased near-codewords may not be corrected by known error decoding algorithms. According to conventional methods, a look-up table can be maintained that lists the known error patterns associated with certain near codewords.

A table storing information related to previously known near-codewords may be utilized to correct newly detected near-codewords. However, an additional level of protection is required to decode the near-codewords that are not listed in such look-up tables. When such a deeply biased unknown near-codeword is encountered, conventional iterative decoders that currently iterate up to some predetermined number of iterations or until a correct codeword is detected, may not be able to successfully resolve such a deeply biased near codeword.

Some conventional non-binary iterative decoders perform LLR biasing to condition an LDPC decoder for efficient LDPC decoding. However, every time an LLR biasing iteration fails, current methods require LLR values for all of the LDPC symbols to be calculated and set in LDPC decoder for every single LLR biasing iteration. Calculating the LLR sign is very computationally intensive and performing such a calculation every time an LLR biasing iteration is performed consumes a lot of power and execution time. Consequently, such an iterative decoding process has a low throughput and a high power consumption. Such high power consumption makes current non-binary iterative decoders poor candidates for use in low power applications such as NAND flash controllers.

Therefore, it would be desirable to provide low power LDPC decoders that can detect and correct near-codewords with a reduced execution time.

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

SUMMARY OF THE DISCLOSURE

Iterative decoding systems, techniques, and processes are disclosed for decoding non-binary near codewords in iteratively decoded communications systems and/or receivers. For example, systems, techniques, and processes are disclosed in which an iterative decoding system can implement a low power and high throughput process to resolve near-codewords in non-binary iterative decoder systems.

In some embodiments, a codeword is received and processed with a soft output Viterbi algorithm to generate an incremental hard decision value and a LLR amplitude value. A faulty symbol in the SOVA processed codeword is identified. A complete hard decision value is generated using the previously generated incremental hard decision value. The LLR amplitude and the complete hard decision value for the identified faulty symbol are then selectively transmitted to a decoder. The decoder decodes the codeword by based on the received LLR amplitude and the complete hard decision value.

In some embodiments, the received codeword is an LDPC codeword. The decoder used to decode the codeword using the LLR amplitude and hard decision values is an LDPC decoder.

In some embodiments, the faulty symbol is only identified once for a given codeword. The location of the faulty symbol is stored in a register once the symbol location is identified.

In some embodiments, the complete hard decision is generated by retrieving the incremental hard decision value, generated during the SOVA run, and a previously calculated complete hard decision value stored in the decoder from a previous decoding iteration. The SOVA generated incremental hard decision value is added to the retrieved complete hard decision value calculated during a previous decoding iteration to update the complete hard decision value. The updated hard decision value is then be stored in the decoder.

In some embodiments, the previously calculated complete hard decision value used to update the complete hard decision value is retrieved from a decoder memory. Once the hard decision value is updated with the incremental hard decision value, the updated hard decision value is stored in the decoder memory.

In some embodiments, the complete hard decision value is stored in a hard decision memory unit. The complete hard decision value stored in the decoder memory from a previous decoding iteration is stored in the hard decision memory. The complete hard decision value is stored in the hard decision memory to reduce the accessing power spent while updating the hard decision value. According to some embodiments, the complete hard decision value is only calculated once and is updated with the incremental hard decision value during every subsequent LLR biasing iteration.

In some embodiments, a memory mask is used selectively provide the LLR amplitude value and hard decision value corresponding to the identified faulty symbol to the decoder. The memory mask allows only the LLR amplitude value and the hard decision value corresponding to the faulty symbol to be changed in the decoder without changing the LLR and hard decision values associated with symbols that have not been identified as faulty. Such a method of selectively providing the LLR amplitude value and hard decision value to the decoder using a memory mask reduces power consumption.

Further features of the invention, its nature and various advantages will be more apparent from the accompanying drawings and the following detailed description.

BRIEF DESCRIPTION OF THE FIGURES

The above and other advantages of the invention will be apparent upon consideration of the following detailed description, taken in conjunction with the accompanying drawings, in which like reference characters refer to like parts throughout.

FIGS. 2A and 2B show an illustrative parity check matrix of an LDPC code and a graphical representation of a decoding process that may be used by an iterative decoder to produce a message estimate, respectively.

DETAILED DESCRIPTION OF THE DISCLOSURE

Systems and methods are provided for enhancing the performance of non-binary iterative low-density parity check decoders. In applications or devices where information can be altered by interference signals or other phenomena, error-correction codes, such as LDPC codes, can provide a measured way to protect information against such interference. As used herein, "information" and "data" refer to any unit or aggregate of energy or signals that contain some meaning or usefulness. Encoding generally refers to the process of generating data in a manner that facilitates subsequent detection and/or correction of errors in the data, while decoding generally refers to the counterpart process of detecting and/or correcting the errors. The elements of a coding system that perform encoding and decoding are likewise referred to as encoders and decoders, respectively.

Figure 1:
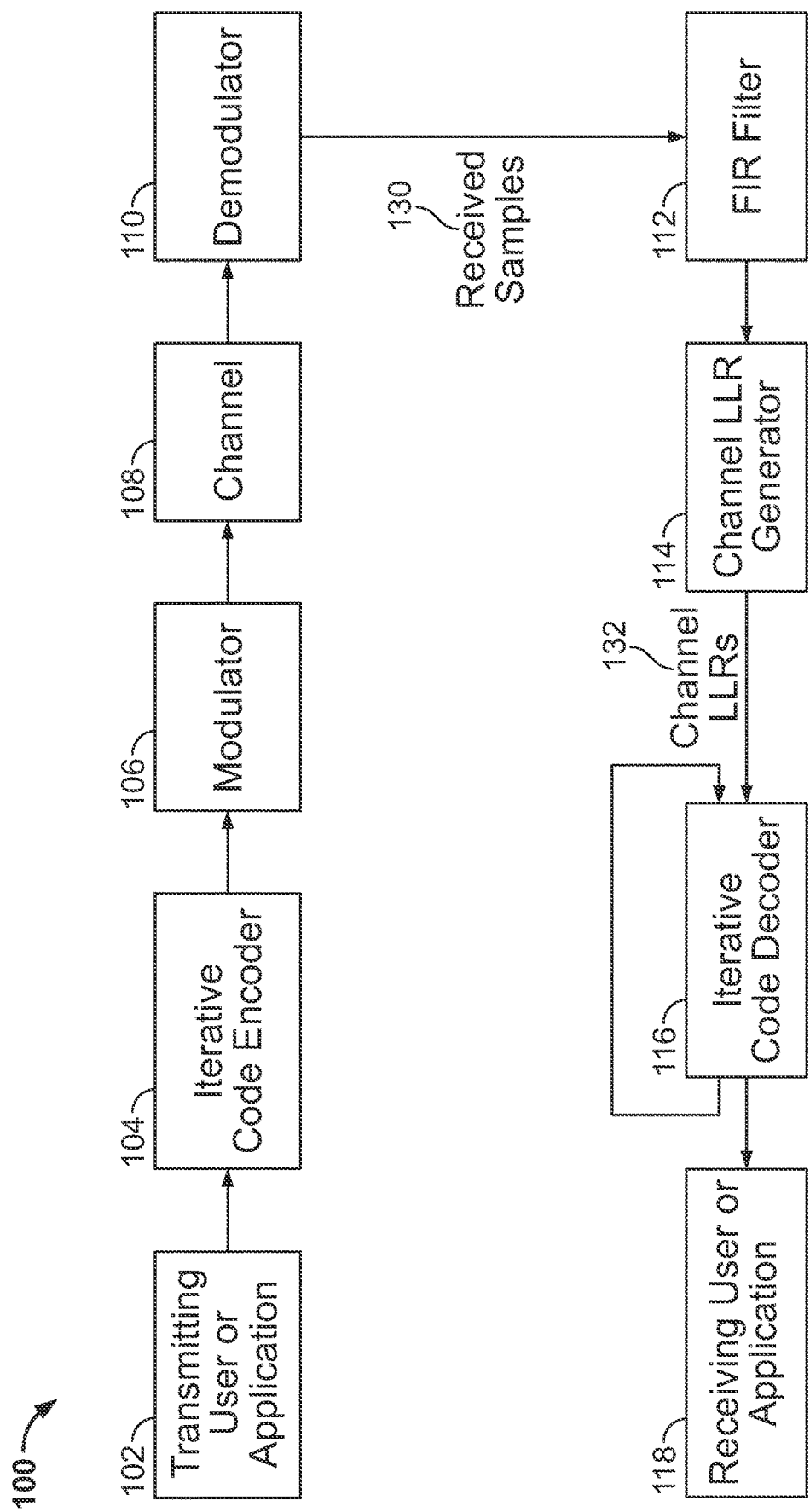
FIG. 1 shows an illustrative communications system employing iterative decoding.

FIG. 1 shows an illustrative communications system 100 employing iterative decoding in accordance with some embodiments. Communications system 100 is used to transmit information from transmitting user or application 102 to receiving user or application 118. Transmitting user or application 102 can be any object or entity that produces information. For example, transmitting user or application 102 may correspond to a software program in a computer system or to a component of a wireless communications transmitter in a radio system. Transmitting user or application 102 produces information in the form of a data stream, and such a data stream may be represented by a sequence of symbol values that have been pre-processed by, for example, a source encoder (not shown in FIG. 1). The information produced by transmitting user or application 102 may correspond to voice information, video information, financial information, or any other type of information that can be represented in digital or analog form, and the data stream produced by transmitting user or application 102 may be a digital data stream.

Transmitting user or application 102 segments or otherwise divides the data stream into blocks of a certain fixed length, and each fixed block is referred to as message. The message may be of length k, meaning that the message includes k symbols, where each symbol may be binary data, ternary data, quaternary data, any other suitable type of data, or any suitable combination thereof. Iterative code encoder 104 is used to encode the message to produce a codeword. Iterative code encoder 104 may be a LDPC encoder, a turbo encoder, or any other suitable encoder. The codeword may be of length n, where n≥k. Iterative code encoder 104 uses a generator matrix to produce the codeword. For example, iterative code encoder 104 may perform one or more operations, including one or more matrix operations, to convert the message into the codeword. The generator matrix is referred to as G, and the codeword is referred to as c.

In one implementation, the codeword is passed to a modulator 106. Modulator 106 prepares the codeword for transmission on channel 108. Modulator 106 may use phase-shift keying, frequency-shift keying, quadrature amplitude modulation, or any suitable modulation technique to modulate the codeword into one or more information-carrying signals suitable for transmission and/or storage on channel 108.

Channel 108 refers to the physical medium through which the transmitted waveform passes or is stored on before being recovered at demodulator 110. For example, channel 108 may be a storage channel that represents a magnetic recording medium in a computer system environment or a communications channel that represents the wireless propagation environment in a wireless communications environment. Various characteristics of channel 108 can corrupt data that is communicated or stored thereon. For example, channel 108 may be a non-ideal memoryless channel or a channel with memory. The output of channel 106 is demodulated and processed by demodulator 110 to produce received samples 130. For example, demodulator 110 may use frequency filters, multiplication and integration by periodic functions, and/or any other suitable demodulation technique to demodulate and/or process the output of channel 108. Received samples 130 contain information related to the codeword, and/or received samples 130 correspond to a corrupted or otherwise altered version of the codeword or the information originally output by iterative code encoder 104. For example, received samples 130 may contain a preliminary estimate or noisy version of the codeword produced by iterative code encoder 104, a probability distribution vector of possible values of the codeword produced by iterative code encoder 104, or to combinations of these as well other items.

Samples from demodulator 110 are equalized by a finite impulse response (FIR) filter 112. The output of FIR filter 112 may be transmitted to a channel log-likelihood ratio (LLR) generator.

Channel LLR generator 114 can be used to calculate channel LLRs 132 based on received samples 130. Channel LLRs 132 may correspond to initial LLR values determined based on received samples 130, a statistical description of channel 108, and/or the probability of the output of iterative code encoder 104. Channel LLRs 132 are formed based on the received samples, and iterations are performed within iterative code decoder 116. These LLR values are computed using the equation $$LLR(b_i) = \log\left(\frac{P(b_i = 0)}{P(b_i = 1)}\right)$$

for each i, where $b_i$ represents the $i^{th}$ bit in a received sample. Iterative code decoder 116 is used to iteratively correct and/or detect errors that may be present in received samples 130, for example, due to transmission through channel 108. To do so, iterative code decoder 116 decodes channel LLRs 132 using a parity check matrix to produce an estimate. The message estimate is referred to as m̂, and the parity check matrix is referred to as H. Iterative code decoder 116 may use any of a number of possible decoding algorithms to produce the message estimate. For example, iterative code decoder 116 may use decoding algorithms known as belief propagation algorithms.

The final codeword from iterative code decoder 116 is delivered to receiving user or application 118 after being processed by the iterative decoding process. Receiving user or application 118 may correspond to the same device or entity as transmitting user or application 102, or it may correspond to a different device or entity. Further, receiving user or application 118 may be either co-located or physically separated from transmitting user or application 102. If the iterative process corrects all errors that may be present, e.g., at the output of FIR filter 112, then the message estimate delivered to receiving user or application 118 is a logical replica of the message output by transmitting user or application 102. Otherwise, the iterative decoder declares error and the communication system will go into retry mode to try to recover the data, or send the erroneous data to the HOST if iterative decoder can not detect the error (this happens if the iterative decoder converged to a valid codeword, but not the one that was transmitted). In the latter case, the message estimate may differ from the message.

Figure 2B:
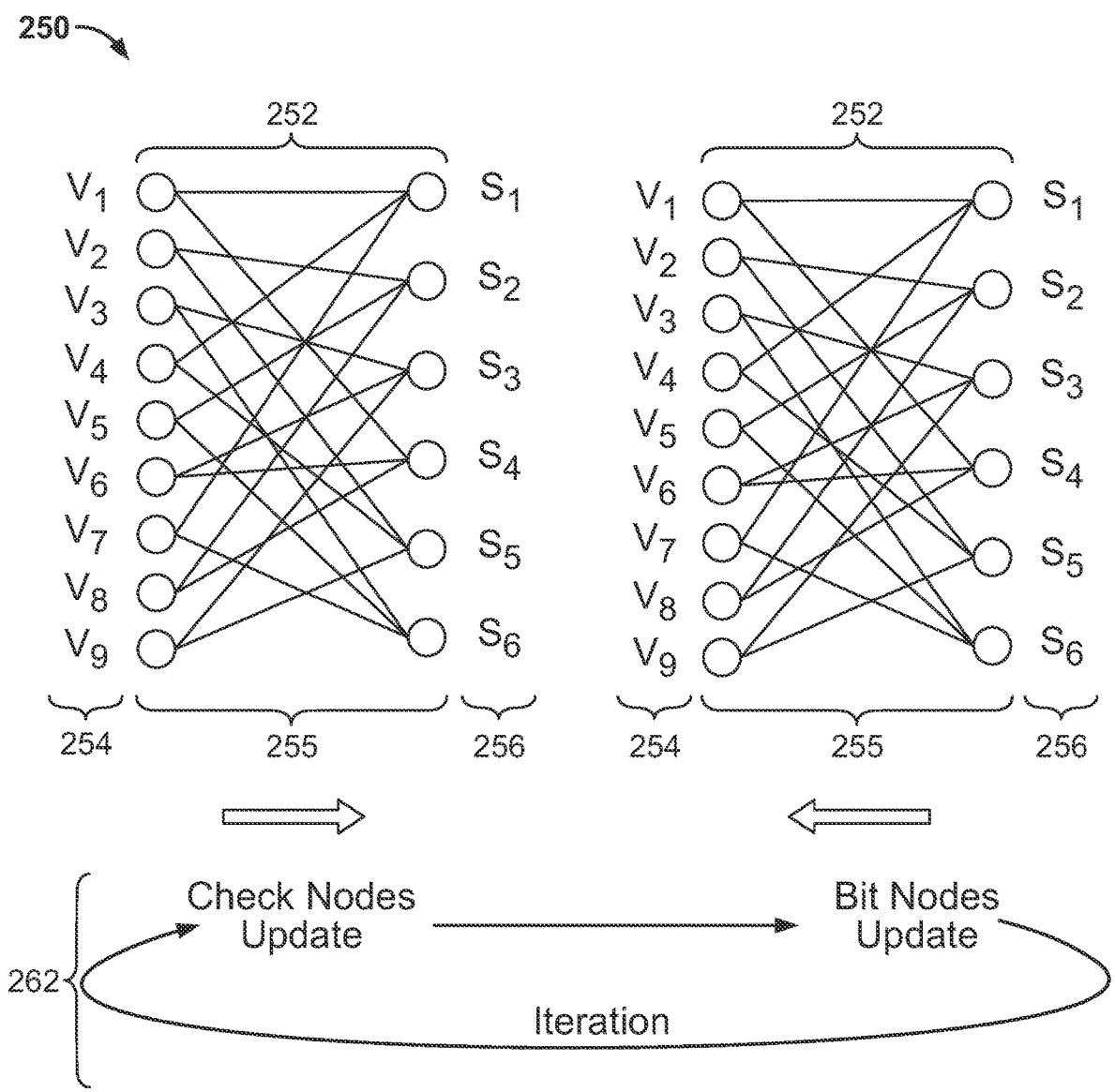

FIG. 2A shows an illustrative parity check matrix 202 for an LDPC code. Parity check matrix 202 has r=6 rows and n=9 columns. Thus, a codeword generated using parity check matrix 202 has a length of n=9 bit-nodes (i.e., symbols). Bit nodes 206 are labeled $v_1, v_2, \ldots v_9$ in FIG. 2A, and each bit node corresponds to a single column of parity check matrix 202. For example, the first bit node, $v_1$, corresponds to the first column in parity check matrix 202, the second bit node, $v_2$, corresponds to the second column in parity check matrix 202, and so on (the meaning of this correspondence will be further described in FIG. 2B).

The value of r denotes the number of check nodes used in the iterative decoder. Thus, the iterative decoder corresponding to parity check matrix 202 uses r=6 check nodes. Check nodes 206 are labeled $s_1, s_2, \ldots s_6$, and each check node corresponds to a single row of parity check matrix 202. For example, the first check node, $s_1$, corresponds to the first row in parity check matrix 202, the second check node, $s_2$, corresponds to the second row in parity check matrix 202, and so on (the meaning of this correspondence will be further described in FIG. 2B).

FIG. 2B graphically illustrates sample decoding process 250, which may be used by an iterative decoder to decode received samples, for example, received samples 130 (FIG. 1), to produce a message estimate. A parity check matrix has been used to generate FIG. 2B, as described below. For simplicity of presentation, it will be assumed that parity check matrix 202 (FIG. 2A) has been used to generate FIG. 2B, as described below.

A Tanner graph (which may also be referred to as a bipartite graph) may be used to graphically represent a LDPC code. For example, Tanner graph 252 is a graphical representation of the LDPC code defined by parity check matrix 202. Bit nodes 254 represent each column in parity check matrix 202, and thus, there are n=9 bit nodes. Bit nodes may also be referred to as symbol nodes or variable nodes. Check nodes 256 represent rows of parity check matrix 202, and thus, there are r=6 check nodes. To create Tanner graph 252 from parity check matrix 202, a line is drawn connecting a given bit node to a given parity check node if and only if a "1" is present in the corresponding entry in parity check matrix 202. For example, since the entry in the second row and fifth column of parity check matrix 202 is a "1", a line is drawn connecting the second check node ($S_2$) to the fifth bit node ($V_5$). Thus, if there are λ "1"s in a given column of parity check matrix 202, then there are λ edges originating from the bit node corresponding to that column in Tanner graph 252. Similarly, if there are ρ "1"s in a given row of parity check matrix 202, then there are ρ edges originating from the parity check node corresponding to that row in Tanner graph 252.

An iterative decoder, for example, as shown in communications system 100 (FIG. 1) may use an iterative two-step decoding algorithm that includes a check nodes update step and a bit nodes update step, as depicted by process 262, to decode received samples, such as received samples 130 (FIG. 1). During the first step (check nodes update step) of each iteration of process 262, messages are sent from bit nodes 254 to check nodes 256 for every pair of connected nodes (this "flow" of information is denoted by the right-pointing arrow in FIG. 2B). Check nodes 256 then perform computations based on the messages that are received. During the second step (bit nodes update step) of each iteration of process 202, messages are sent from bit nodes 254 to check nodes 256 for every pair of connected nodes (this is denoted by the left-pointing arrow in FIG. 2B). Process 262 is repeated until either the codeword has been decoded or until a threshold number of rounds has been reached. Process 262 then produces a message estimate. The content of messages sent during each step of each iteration of process 262 depends on the decoding algorithm used in the iterative decoder. The content may correspond to LLR values, probabilities, hard decisions, or any other suitable type of content that is compatible with the decoding algorithm.

Figure 3:
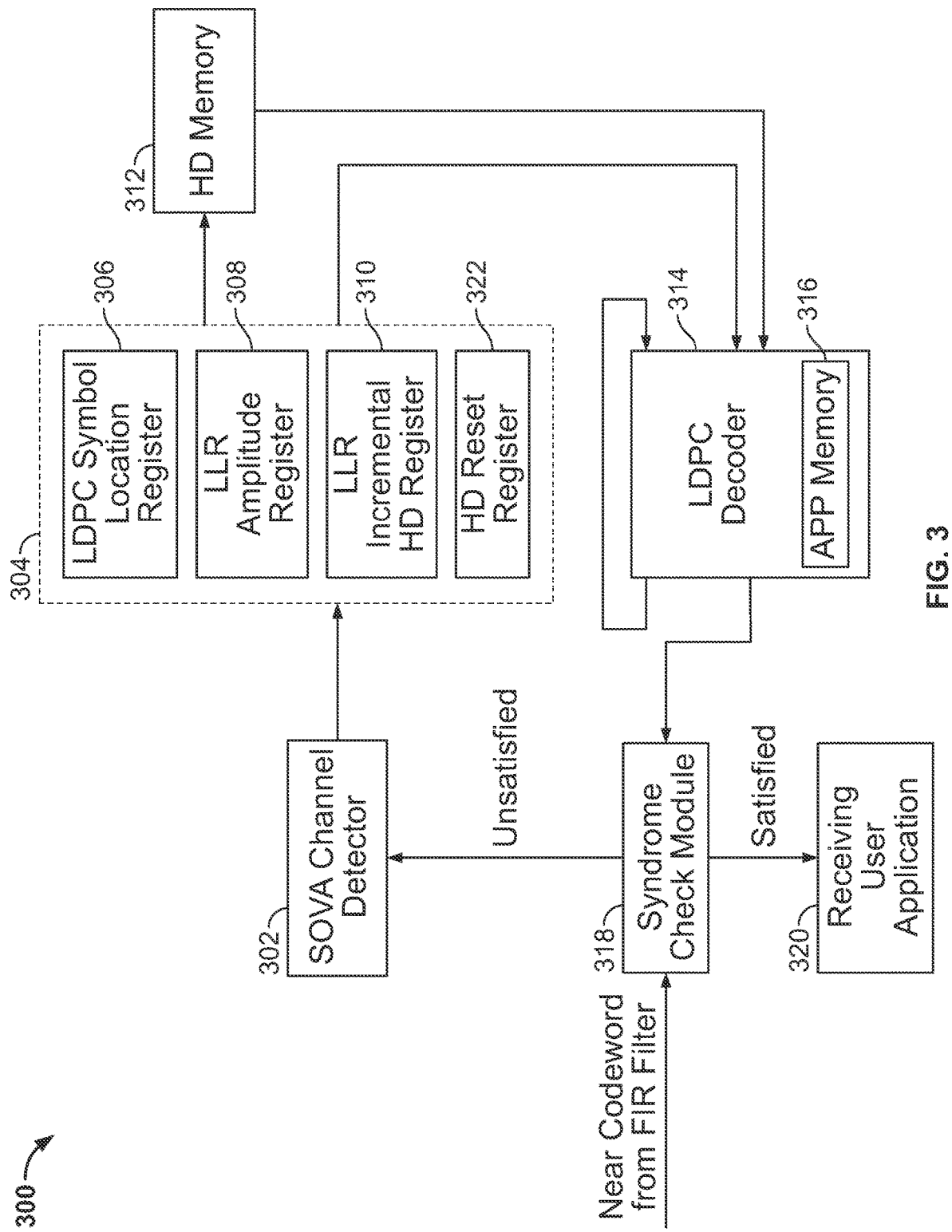
FIG. 3 shows an illustrative block diagram of the components of an iterative decoder.

FIG. 3 shows the structure and processes that may be used by an iterative decoder, such as the iterative decoder of communications system 100 (FIG. 1), in some embodiments to produce a message estimate from received samples (such as received samples 130 of FIG. 1). Iterative decoder 300 is advantageous in improving (i.e., lowering) the error-rate performance of a communications system, such as communications system 100.

Iterative decoder 300 receives a codeword from FIR filter and conditions it for LLR biasing. Decoder 300 determines if the received codeword requires needs to be corrected. If the decoder determines that the received codeword is a near codeword, it calculates the location of the faulty LDPC symbols that require correction. The decoder then generates LLR information and stores this information efficiently to reduce the power consumption and execution time of the decoding process. The decoder than executes a predetermined amount of LDPC iterations using the generated LDPC information to correct the identified faulty symbols of the LDPC codeword.

Iterative decoder 300 includes a SOVA channel detector 302, register array 304, HD memory 312, LDPC decoder 314, and syndrome check module 318. Once the near-codeword has been correctly decoded, the final codeword is transmitted to receiving user application 320.

According to some embodiments, during the first iteration of decoding a received codeword from FIR filter 112, syndrome check module 318 receives failed or near codewords from FIR filter 112. Upon receiving near codewords from FIR filter 112, syndrome check module 318 calculates a true syndrome based on the received codeword. A syndrome weight is output from syndrome check module 318 upon calculating the true syndrome associated with the received near codeword. If the syndrome weight is below a previously defined threshold value, then syndrome check module 318 passes the codeword to receiving user application 320. However, if the syndrome weight is above a previously defined threshold value, then syndrome check module 318 sends the near codeword to SOVA channel detector 302. In addition, the firmware uses the true syndrome calculation to determine the LDPC symbols that are associated with unsatisfied checks and need to be changed to correct the near codeword. Once these erroneous LDPC symbols are identified by the firmware, the firmware populates LDPC symbol location register 306 with the location of the identified LDPC symbols. These stored values in register 306 will be used in the deterministic LLR biasing process discussed below to correct the near-codeword.

Iterative decoder 300 may use a soft-output Viterbi algorithm (also known as SOVA algorithm) to decode the output of FIR filter 112, passed through syndrome check module 318.

SOVA channel detector 302 obtains channel LLRs based on the received samples, and passes channel LLRs to register array 304 to be used in deterministic LLR biasing. SOVA channel detector 302 runs the SOVA algorithm once using the received samples. Once the SOVA channel detector 302 runs the SOVA algorithm for a received codeword for the first time, SOVA channel detector 302 populates APP memory 316 of LDPC decoder 314 with the LDPC symbols. SOVA channel detector 302 calculates the LLR amplitude and an incremental LLR hard decision (HD) value. An LLR value consists of an LLR amplitude and an LLR sign, also referred to as the hard decision value. The hard decision value is required to calculate the true syndrome. The true syndrome calculation may be performed for only near codewords, after a decoding attempt has been made on the codeword. Once a codeword has undergone the decoding process, a hard decision value is generated and stored in APP memory 316 of LDPC decoder 314. In an alternative embodiment, APP memory 316 could be located in circuitry separate from LDPC decoder 314. LDPC decoder uses the LLR amplitude and hard decision values stored in such a separate APP memory.

Calculating the complete hard decision value is computationally intensive and is therefore only performed once, whilst performing the true syndrome calculation. Once the complete hard decision value is calculated, the firmware stores this hard decision value in HD memory 312. HD memory 312 has a smaller dimension than APP memory 316 and is used to keep track of the hard decision value across multiple LLR biasing iterations. At the start of every LLR biasing operation, SOVA is run to calculate an incremental hard decision value.

Calculating an incremental hard decision value is less computationally intensive and requires less execution time than calculating the complete hard decision value. Once SOVA channel detector 302 implements a SOVA run and generates incremental hard decision values, these incremental hard decision values are passed to LLR incremental HD register 310 to be used later in the deterministic LLR biasing process. The incremental HD value is added to the HD value previously stored in the HD memory 312 to generate the new complete HD value which will later be written to APP memory 316 for the identified faulty LDPC symbols. Since the HD value needs to be updated every time LLR biasing is performed, the smaller dimension of HD memory 312 helps reduce accessing power for read and write operations. During a deterministic LLR biasing operation, either one, two, or three of the LDPC symbol locations may change their current HD value. These symbols correspond to the identified erroneous symbol locations stored in LDPC symbol location register 306.

In addition to generating the incremental HD value, SOVA channel detector 302 also generates the input decoder LLR amplitude for the erroneous LDPC symbols stored in LDPC symbol location register 306. According to a preferred embodiment of iterative decoder 300, the LDPC decoder input LLR is set to maximum value for the identified LDPC symbol locations and stored in LLR amplitude register 308. For example, the firmware identifies the LDPC symbol location for which the decoder input LLR amplitude should be set to maximum value by reading the location values of the erroneous LDPC symbols stored in LDPC symbol location register 306. Once these locations have been read out from LDPC symbol location register 306, the firmware stores the maximum decoder input LLR value for these identified LDPC locations in LLR amplitude register 308.

HD reset register 322, part of register array 304, is used by the firmware to determine whether to copy the HD value from APP memory 316 to HD memory 316 before SOVA is run during a deterministic LLR biasing iteration. For example, the firmware may store a 1 to indicate the HD value from APP memory 316 should be copied to HD memory 312. Alternatively, firmware may store a 0 to indicate the HD value from APP memory 316 should not be copied to HD memory 312. Before the firmware instructs SOVA channel detector 302 to run SOVA, the firmware checks the value of HD reset register 322 to determine whether to copy the HD value from APP memory 316 to HD memory 312.

LDPC decoder 314 may produce a preliminary estimate of a message using processes similar or identical to the processes described in FIGS. 2A and 2B. For example, LDPC decoder 314 may use an iterative decoding algorithm including the min-sum or sum-product algorithm, or any suitable approximation or variation thereof, to produce output.

According to an embodiment, once the current HD value has been calculated, the firmware transmits the current HD value stored in HD memory 312 to LDPC decoder 314, more specifically to APP memory 316 within LDPC decoder 314. Similarly, once LLR amplitude register 308 has been updated with the LLR amplitude values, the firmware transmits the LLR amplitude values stored in LLR amplitude register 308 to APP memory 316.

According to another embodiment, HD memory 312 stores the absolute HD value for the LDPC symbols stored in APP memory 316 in the previous decoding iteration. Once the firmware stores the incremental HD value, generated by the SOVA channel detector 302, in LLR incremental HD register 310, the firmware reads the absolute HD value from the previous decoding iteration stored in HD memory 312 and adds to it the incremental HD value stored in LLR incremental HD register 310 and stores the new complete HD value in APP memory 316. At a later point, the firmware copies the current complete HD value stored in APP memory 316 back to HD memory 312 for the next LLR biasing iteration. The firmware keeps the HD memory 312 in a low leakage state when it is not actively writing to or reading from it in order to reduce power consumption.

According to a preferred embodiment, only the LLR amplitude and hard decision values for the faulty LDPC symbols identified by LDPC symbol location register 306 are changed in APP memory 316.

In order to prevent overwriting the LLR values stored in APP memory 316, a memory mask is used to modify only the LLR values for the faulty LDPC symbols. Such a memory mask prevents unnecessarily changing LLR values for acceptable LDPC symbols and also minimizes the number of write operations to APP memory 316, thereby reducing accessing power. The firmware provides absolute LLR amplitude from LLR amplitude register 308 and the absolute hard decision value from HD memory 312 to APP memory 316. Therefore, it is not necessary to read and modify the previously stored LLR values in APP memory 316 for the faulty LDPC symbol locations. Instead, the firmware uses a memory mask to directly write the LLR values from the current LLR biasing iteration over previously stored LLR values in APP memory 316 for the addresses corresponding to the faulty LDPC symbols.

According to some embodiments, a memory mask is formatted to match the address of the APP memory in order to replace the LLR values of the correct LDPC symbol stored in APP memory 316. The LLR amplitude and hard decision values stored in LLR amplitude register 308, LLR incremental hard decision register 310, and HD memory 312 is shifted by the firmware into a format that is compatible with the APP memory address before being transmitted to APP memory 316. In an implementation, the LLR values stored in APP memory 316 are formatted as a 7 bit value. The first two most significant bits are 2'b00 while the five least significant bits are the values stored in LLR amplitude register 308, LLR incremental hard decision register 310, and HD memory 312. Similarly, the memory address for each LDPC symbol location is also formatted according to a specific convention. Accordingly, the memory mask is formatted to this format in order to properly replace the LLR values in APP memory 316.

Writing to APP memory 316 using the memory mask conserves power. By only writing the LLR values of the erroneous LDPC symbols to APP memory and masking out the LLR values of the other LDPC symbols stored in APP memory 316, a small portion of the wide APP memory 316 is accessed, thereby conserving power. In some embodiments, the firmware places the HD memory 312 in low leakage mode when it is not being read or written to, thereby conserving additional power. Similarly, the firmware places APP memory 316 in low leakage mode when it is not being read or written to, thereby conserving additional power.

LDPC decoder 314 may produce a preliminary estimate of a message using processes similar or identical to the processes described in FIGS. 2A and 2B. For example, LDPC decoder 314 may use an iterative decoding algorithm including the min-sum or sum-product algorithm, or any suitable approximation or variation thereof, to produce output.

Iterative decoder 300 continues iterative processing between SOVA channel detector 302 and LDPC decoder 314 for a certain number of iterations before terminating the iterative process and outputting a message estimate. For example, iterative decoder 300 runs for a fixed and predetermined number of iterations, until convergence of LLRs values and/or until an output having zero syndrome weight is determined. If the iterative decoder still fails to decode the codeword, then a near codeword is detected and the firmware generates a flag to begin another iteration of the LLR biasing process.

An iterative two-step decoding algorithm known as a message passing algorithm may be employed by, for example, LDPC decoder 314 to decode a received codeword. In the first step of message passing algorithm, all or some of the check nodes are updated based on messages received from all or some of variable nodes. In the second step of the message passing algorithm, all or some of the variable nodes are updated based on messages received from all or some of the check nodes. The process is repeated until either the codeword has been decoded or until a threshold number of iterations or sub-iteration has been reached.

LDPC decoder 314 may perform the update steps of message passing algorithm in accordance with a serial (layered) or flooding decoding schedule. In some embodiments, for example, when using some flooding techniques, all check nodes should be updated before a variable node may be updated and all variable nodes should be updated before a check node is updated. In layered decoding, only those check nodes necessary for updating a particular variable node may be updated, and only those variable nodes necessary for updating a particular check node are updated.

Tanner graphs in FIG. 2B are used to illustrate the message passing algorithm as employed by LDPC decoder 314. The message passing algorithm performs several rounds (iterations or sub-iterations) of message updates in accordance with the structure of the Tanner graph 252 associated with the parity check matrix 202 (FIG. 2A) of the LDPC code to be decoded. In layered LDPC decoding, each sub-iteration of the message passing algorithm includes processing several check nodes. These check nodes are grouped into layers, which represent physical locations in APP memory 316, such that each sub-iteration may process a group of check nodes belonging to the same layer.

For example, in a first sub-iteration, some of the check nodes 256 (for example, check nodes $S_1$ and $S_2$) receive messages from some of the variable nodes 254 to which they are connected. Check nodes $S_1$ and $S_2$ then perform an update by carrying out computations based on the messages that they receive and a set of update rules. Then, check nodes $S_1$ and $S_2$ send messages to the variable nodes to which they are connected. The variable nodes connected to check nodes $S_1$ and $S_2$ (i.e. variable nodes $V_1$, $V_4$, $V_7$ and variable nodes $V_2$, $V_5$ and $V_8$) then perform an update by carrying out computations based on the messages that they receive and a set of update rules.

Sub-iterations may be repeated until either the codeword has been decoded or until a threshold number of sub-iterations has been reached. As discussed above, the messages may correspond to LLR values. The messages that are sent during each step of each iteration or sub-iteration of message passing algorithm depend on the update rules and the scheduling of the update steps.

Once LDPC decoder 314 has completed its several iterations, the firmware passes the final codeword to syndrome check module 318. Syndrome check module 318 computes the syndrome weight of the newly calculated codeword. If the syndrome weight is below a certain predetermined threshold set by the firmware, then the firmware determines that the calculated codeword is satisfactory and passes it along to receiving user application 320. On the other hand, if the syndrome weight is above the predetermined threshold set by the firmware, then the firmware determines that another iteration of LLR biasing needs to be performed. In such an event, the firmware copies the complete HD value for the erroneous LDPC symbols to HD memory 312 and instructs SOVA channel detector 302 to perform another SOVA run.

Figure 4:
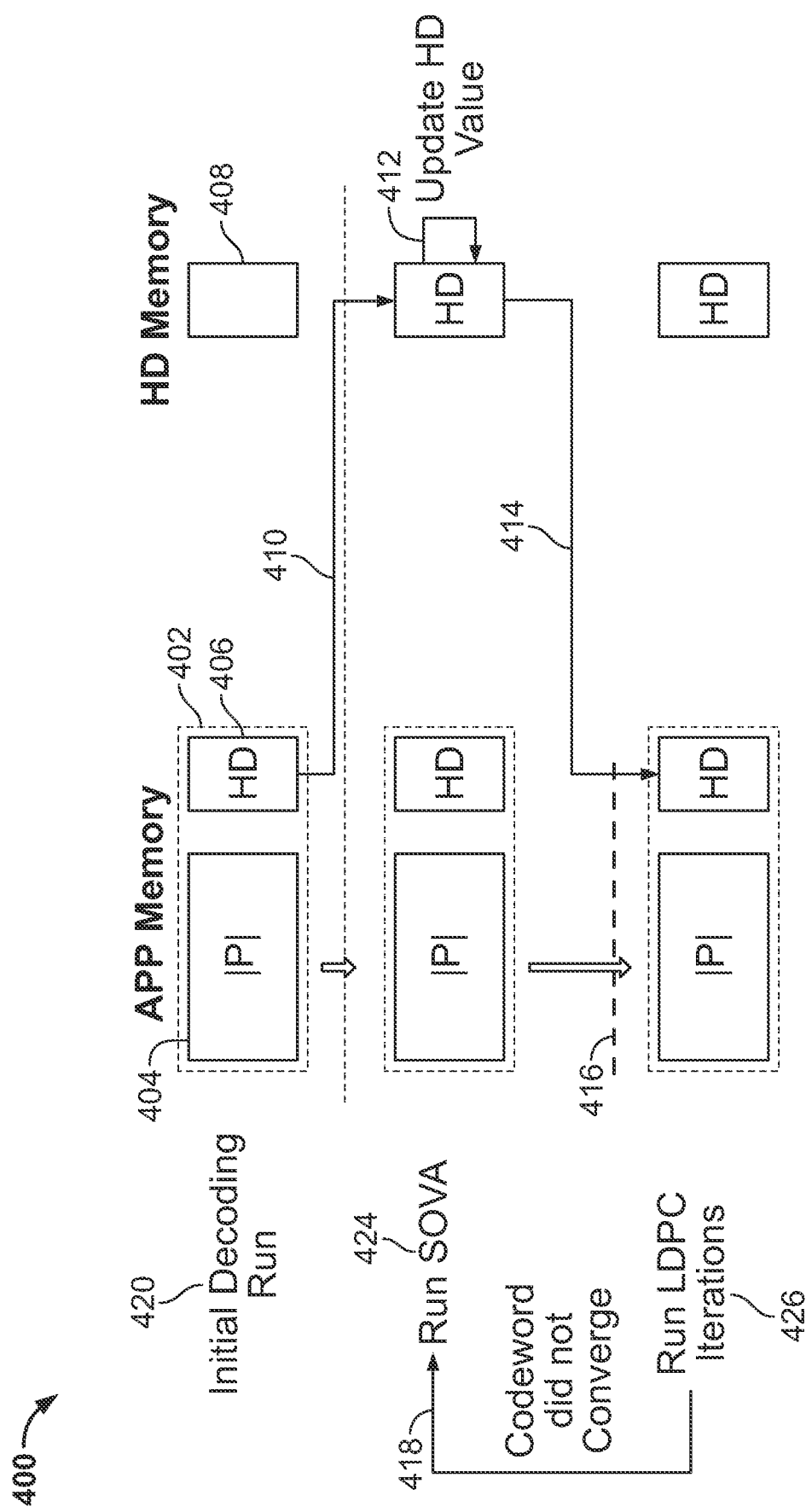
FIG. 4 shows depicts the processes implemented on different memory units in order to decode a failed codeword in accordance with several embodiments.

FIG. 4 shows the processes in which the APP memory of the LDPC decoder and the HD memory are used throughout one iteration of the LLR biasing process. LLR biasing process 400 is initiated once a syndrome check module 318 determines that LDPC decoder 314's previous attempt at decoding a codeword has failed.

At 420, a codeword is received for the first time by iterative decoder 116 from FIR filter 112 and SOVA channel generator 302 executes the SOVA algorithm once. Both LLR amplitude values (|P|) and hard decision values are generated and stored in APP memory 402, which corresponds to APP memory 316 of FIG. 3. In particular, the LLR amplitude values are stored in portion 404 of APP memory and the hard decision values are stored in portion 406 of APP memory 402. LDPC decoder 314 executes an N amount of LDPC iterations and if syndrome check module 318 determines that the syndrome weight of the codeword still exceeds a predetermined syndrome weight, the firmware issues a command to execute an additional global iteration and N LDPC iterations. Once such a command has been received, the firmware instructs syndrome check module 318 to calculate the true syndrome. The hard decision value stored in portion 406 of APP memory 402 is used to perform the true syndrome calculation. Once the true syndrome calculation is finished, the firmware uses the syndrome to generate the LDPC symbol locations corresponding to the unsatisfied checks. The firmware stores the location of these faulty LDPC symbols in LDPC symbol location register 306. The true syndrome is only calculated once even though there might be multiple LLR biasing global iterations. Once the faulty LDPC symbol locations are calculated, the subsequent decoding process attempts to resolve the errors in those LDPC symbols. Therefore, there is no need to calculate a true syndrome more than once to determine the faulty LDPC symbols since the locations of the faulty LDPC symbols are stored in LDPC symbol location register 306 and will be retained across multiple LLR biasing iterations. After the true syndrome calculation is performed and the faulty LDPC symbols have been identified, the firmware issues a command to save the hard decision values to a smaller memory. For example, the firmware may set the value of HD reset register 322 to 1.

At 424, the firmware checks the value of HD reset register 322. If the value is determined to be 1, then the firmware copies the previously stored complete HD value in portion 406 of APP memory 402 to HD memory 408. The hard decision value is stored in smaller dimension memory 408 in order to prevent accessing the wider APP memory while modifying the HD value.

Once the HD value has been copied to memory 408, SOVA channel detector 302 executes SOVA once. As a result, the incremental HD value generated by running SOVA is copied to the LLR incremental HD register 310 and the LLR amplitude generated from the SOVA run is stored in LLR amplitude register 308. The LLR amplitude is copied to portion 404 of APP memory 402 using memory mask 416. In this manner, only the LLR amplitude values for the faulty LDPC symbols are overwritten in portion 404 of APP memory 402.

The complete HD value is also updated with the incremental HD value generated by the SOVA run. According to the embodiment depicted in FIG. 4, the incremental HD value stored in incremental HD register 310 is added to the previously stored complete HD value in HD memory 408. The previously stored HD values in memory 408 are read out from HD memory 408 and the incremental HD value is read out from register 310. The firmware adds these values and stores them in memory 408 as shown at 412. Once the HD memory 408 has been updated with the incremental HD value from the most recent SOVA run, the new complete HD value is copied to portion 406 of APP memory 402, as shown at 414.

In another embodiment, a previous decoding iteration's HD value stored in HD memory 408 and the incremental HD value stored in register 310 may be read by firmware. The firmware adds the two values to calculate the new complete HD value and stores this value in portion 406 of APP memory 408 directly. Once the previously stored HD value in memory 408 has been read, the firmware places HD memory 408 in low leakage mode to conserve power.

Once the firmware transfers the values of the LLR amplitude and hard decision to APP memory 402, the firmware sends a command to LDPC decoder 314 to begin running N LDPC iterations at 426. As soon as the decoder converges to a codeword, the decoding process is completed and the final codeword is transmitted to receiving user application 320. However, if the LDPC decoder does not converge after N LDPC iterations, then the firmware returns to 424 as shown at 418.

The firmware copies the complete hard decision value from portion 406 of APP memory 402 into memory 408 to be updated with a new incremental HD value calculated by a new SOVA run. Once again, SOVA is run and the process repeats until the near codeword is corrected.

The initial decoding run (420) in which the true syndrome is calculated and the absolute HD value is computed only occurs once regardless of how many global LLR biasing iterations iterative decoder 116 undergoes. Since the true syndrome is only calculated once, execution time is drastically reduced.

Figure 5:
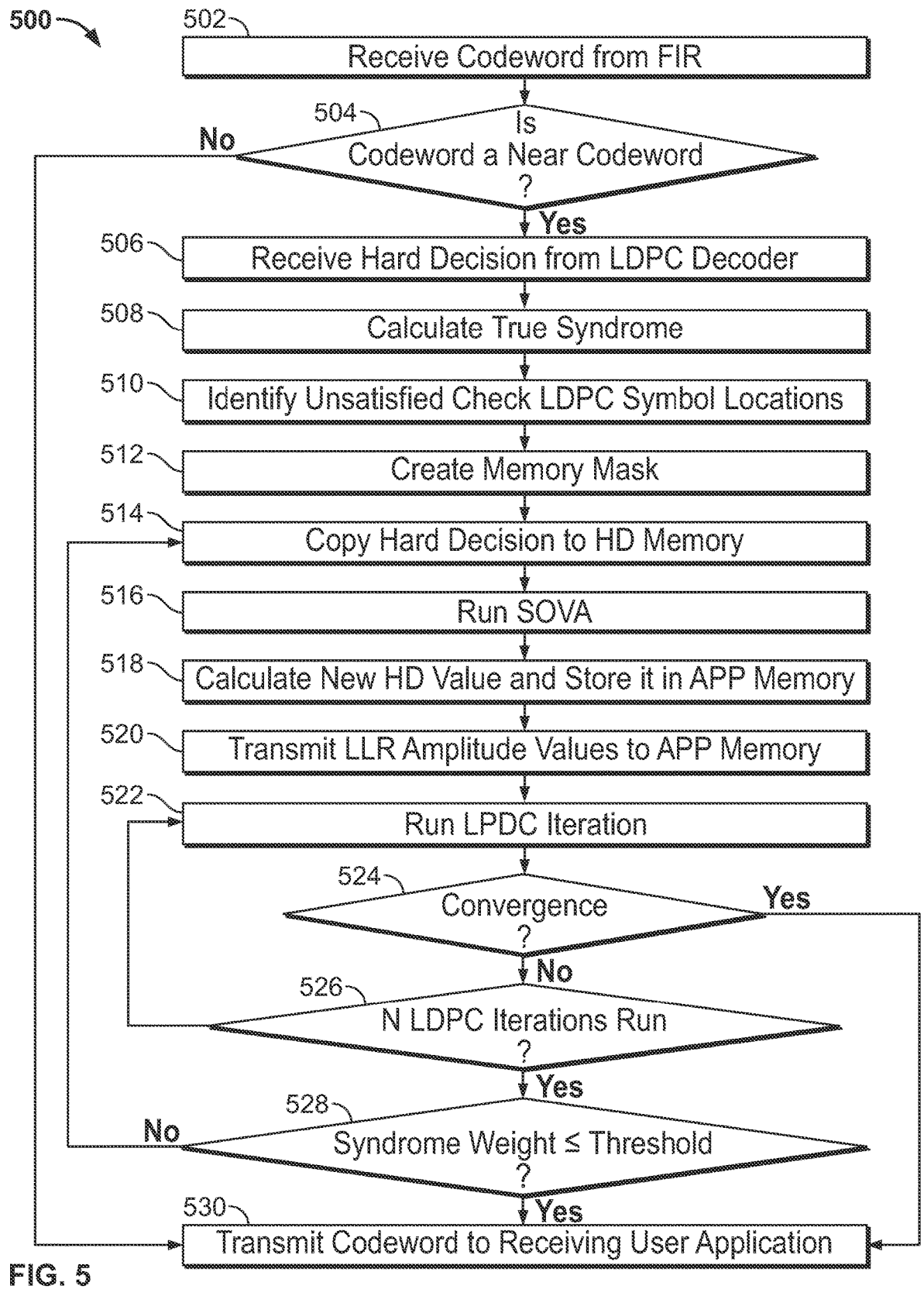
FIG. 5 shows an illustrative process that may be used to resolve a failed codeword in accordance with some embodiments.

FIG. 5 shows an illustrative process 500 that may be used to correct near codewords in iterative decoder 116. Process 500 may be performed by firmware. Process 500 may begin at 502.

At 502, iterative decoder 116 receives a codeword from FIR filter 112. Once iterative decoder 116 receives the codeword, the firmware determines whether the codeword is a near codeword or not at 504. In an embodiment, such a determination includes checking to see if decoder 314 has previously attempted to decode the codeword and whether it has been unsuccessful. In another embodiment, such a determination includes checking to determine whether the codeword contains an indication that it is a near codeword. If the firmware determines that the received codeword is not a near codeword but rather a satisfactory codeword, then the firmware passes the codeword to receiving user application at 528 bypassing the entire deterministic LLR biasing process since the codeword does not need further decoding. However, if the firmware determines that the codeword is indeed a near codeword in need of further decoding to correct the unsatisfied LDPC symbols, then the firmware progresses to 506.

At 506, firmware reads the hard decision value stored in the LPDC decoder. In particular, the firmware reads the complete hard decision value stored in portion 406 of APP memory 402.

At 508, the firmware issues a command to syndrome check module 318 to calculate the true syndrome. Firmware provides the complete hard decision value from portion 406 of APP memory 402 to the syndrome check module 318. The hard decision value is necessary to calculate the true syndrome.

At 510, the firmware identifies the unsatisfied check LDPC symbol locations. The firmware calculates these faulty LDPC symbol locations from the results of the true syndrome calculation. The firmware stores these identified faulty LDPC symbols in LDPC symbol location register 306.

At 512, the firmware creates a memory mask using the identified faulty LDPC symbol locations. Such a memory mask is formatted to match the address format of APP memory 402 in order to replace the correct LLR values for the faulty LDPC symbols stored in APP memory 402.

At 514, the firmware copies the LLR hard decision value from APP memory 402 and stores it in a smaller HD memory 312. Storing the HD value in a smaller memory reduces the accessing power when the HD value is read and modified with the new incremental HD values from a SOVA run.

At 516, the firmware instructs SOVA channel detector 302 to execute a SOVA run. The SOVA run generates LLR amplitude and incremental hard decision values. The firmware stores the LLR amplitude and incremental hard decision values in LLR amplitude register 308 and LLR incremental HD register 310, respectively.

At 518, the firmware calculates the new complete HD value using the incremental HD value stored in incremental HD register 310 and the complete HD value that was previously stored in HD memory 312. Upon calculating the new HD value, the firmware stores the new HD value in APP memory 402 using the memory mask 416 in order to only modify the HD values for the faulty LDPC symbols.

At 520, the firmware transmits the input decoder LLR amplitude values stored in LLR amplitude register 308 to APP memory 402. The firmware uses mask 416 to only replace the LLR amplitude values for the faulty LDPC symbols in APP memory 402.

At 522, the firmware instructs LDPC decoder 314 to run several LDPC iterations. The firmware instructs the LDPC decoder to perform an LDPC iteration using the LLR information stored in APP memory 402. At 524, after the LDPC iteration is complete, the firmware determines if the codeword has converged. If the firmware determines that the near codeword has indeed converged, then the codeword is transmitted to the receiving user application at 530. However, if the codeword does not converge, then the firmware checks if the LDPC decoder 314 has run a predetermined N number of LDPC iterations using the LLR information in APP memory 402 at 526. If N iterations have not been run, then the process reverts to 522 to run another LDPC iteration. Once N LDPC iterations have been run and LDPC decoder 314 has not indicated that the near codeword has converged, a syndrome weight is calculated at syndrome check module 318. In another embodiment, firmware may terminate the LDPC iterations before N LDPC iterations have been run if the firmware receives user input to terminate the decoding process before N LDPC iterations have been executed. At 528, the firmware determines if the syndrome weight for the codeword is less than or equal to a previously predetermined threshold. If the syndrome weight is less than or equal to the threshold, then the codeword is transmitted to the receiving user application at 530. However, if the syndrome weight is greater than the threshold, then the process reverts back to 514 to begin another iteration of deterministic LLR biasing.

Figure 6:
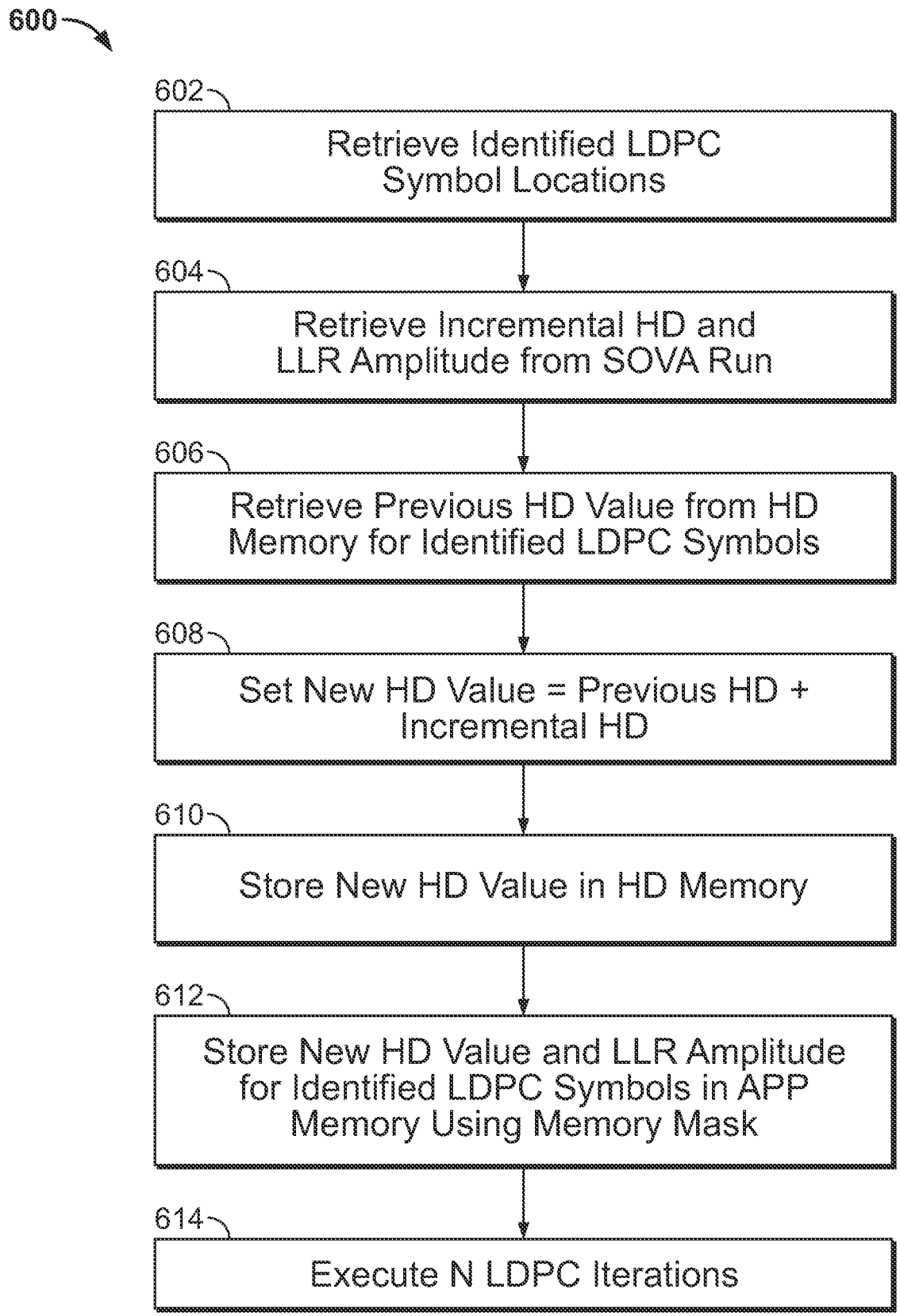
FIG. 6 shows an illustrative process that may be used to perform LLR biasing to resolve a failed codeword in accordance with some embodiments.

FIG. 6 shows an illustrative process 600 that illustrates a process by which the firmware instructs the hardware to perform deterministic LLR biasing according to some embodiments.

At 602, the firmware retrieves identified LDPC symbol locations. The firmware retrieves these LDPC symbol locations from LDPC symbol location register 306.

At 604, the firmware retrieves the incremental HD and decoder input LLR amplitudes generated by the last SOVA run. The firmware stores these values in LLR amplitude register 308 and LLR incremental HD register 310, overwriting any previously stored values in these registers.

At 606, the firmware reads the complete HD values stored in HD memory 312 obtained from the previous LDPC decoder's APP memory after the decoder's previous LDPC iteration. The firmware reads the HD values for the faulty LDPC symbols.

At 608, the firmware calculates the new HD value to be used in the current LLR biasing iteration. To do so, the firmware adds the complete HD value obtained from HD memory 312 to the incremental HD value computed from the last SOVA run.

At 610, the firmware stores the new complete HD value in HD memory 312.

At 612, the firmware stores the newly calculated HD values and the decoder input LLR amplitude for the faulty LDPC symbols in APP memory 402. Memory mask 416 is used to ensure that the previously stored LLR values for the LDPC symbols that were not identified as faulty symbols are not modified. The use of such a memory mask 416 ensures that these regions of APP memory 402 will not be accessed, thereby minimizing accessing power.

At 614, the firmware instructs LDPC decoder 314 to execute N LDPC iterations using the decoder input LLR values stored in APP memory 402. The LDPC calculations are performed based on the LLR values stored in the APP memory 402.

Those skilled in the art will appreciate that the invention can be practiced by other than the described embodiments, which are presented for the purpose of illustration rather than of limitation.

What is claimed is:

1. A method for iteratively decoding a codeword, the method comprising:
   receiving a wireless signal from a wireless communications channel;
   generating a codeword from the received wireless signal;

retrieving a biasing hard decision value from a soft output Viterbi algorithm (SOVA) run;
at each current iteration:
retrieving a previously generated hard decision value, indicative of an estimated decoded value corresponding to the codeword, that is generated from a previous iteration preceding the current iteration, from a memory in the decoder, wherein the previously generated hard decision value was stored in the decoder from a previous decoding iteration;
generating an updated hard decision value indicative of an updated decoded value for the current iteration by adding the biasing hard decision value to the previously generated hard decision value of the previous iteration;
storing the updated hard decision value for the current iteration in the memory to replace the previously generated hard decision value as an intermediate decoded value of this iteration;
and
transmitting data corresponding to the decoded codeword to a target application.

2. The method of claim 1, wherein the codeword is a low density parity check (LDPC) codeword and is processed during the SOVA run.

3. The method of claim 1, further comprising:
identifying at least one faulty symbol in the codeword; and
providing the LLR amplitude value and the updated hard decision value corresponding to the at least one identified faulty symbol to the decoder.

4. The method of claim 3, wherein a mask is used to provide the LLR amplitude value and the updated hard decision value of the at least one identified faulty symbol to the decoder without changing previously stored LLR amplitude and hard decision values in the decoder for symbols that have not been identified.

5. The method of claim 3, wherein the at least one identified faulty symbol is only identified once for a given codeword.

6. The method of claim 1, wherein the updated hard decision value is a symbol-level hard decision value.

7. The method of claim 1, wherein generating the updated hard decision value further comprises:
calculating a complete hard decision value only once; and
updating the complete hard decision value with the biasing hard decision value during every subsequent LLR biasing iteration.

8. The method of claim 7, further comprising storing the complete hard decision value in a second memory external to the decoder, wherein the second memory has a smaller dimension than a first memory included in the decoder.

9. A system for iteratively decoding a codeword, comprising:
a wireless receiver configured to receive a wireless signal;
a demodulator to generate a codeword from the received wireless signal;
a decoder;
processing circuitry configured to:
retrieve a biasing hard decision value from a soft output Viterbi algorithm (SOVA) run;
at each current iteration:
retrieve a previously generated hard decision value, indicative of an estimated decoded value corresponding to the codeword, that is generated from a previous iteration preceding the current iteration, from a memory in the decoder, wherein the previously generated hard decision value was stored in the decoder from a previous decoding iteration;
generate an updated hard decision value indicative of an updated decoded value for the current iteration by adding the biasing hard decision value to the previously generated hard decision value of the previous iteration;
store the updated hard decision value for the current iteration in the memory to replace the previously generated hard decision value as an intermediate decoded value of this iteration;
and
transmit data corresponding to the decoded codeword to a target application.

10. The system of claim 9, wherein the codeword is a low density parity check (LDPC) codeword and is processed during the SOVA run.

11. The system of claim 9, wherein the processing circuitry is further configured to:
identify at least one faulty symbol in the codeword; and
provide the LLR amplitude value and the updated hard decision value corresponding to the at least one identified faulty symbol to the decoder.

12. The system of claim 11, wherein a mask is used to provide the LLR amplitude value and the updated hard decision value of the at least one identified faulty symbol to the decoder without changing previously stored LLR amplitude and hard decision values in the decoder for symbols that have not been identified.

13. The system of claim 11, wherein the at least one identified faulty symbol is only identified once for a given codeword.

14. The system of claim 9, wherein the updated hard decision value is a symbol-level hard decision value.

15. The system of claim 9, wherein the processing circuitry is further configured to:
calculate a complete hard decision value only once; and
update the complete hard decision value with the biasing hard decision value during every subsequent LLR biasing iteration.

16. The system of claim 15, wherein the processing circuitry is further configured to store the complete hard decision value in a second memory external to the decoder, wherein the second memory has a smaller dimension than a first memory included in the decoder.

17. A method for iteratively decoding a codeword, the method comprising:
receiving a wireless signal from a wireless communications channel;
obtaining a codeword from the received wireless signal;
calculating a complete hard decision value of the codeword, indicative of an estimated decoded value corresponding to the codeword, only once;
storing the complete hard decision value in a memory of a decoder as a previously generated hard decision value; and
retrieving a biasing hard decision value from a soft output Viterbi algorithm (SOVA) run,
at each current iteration:
retrieving the previously generated hard decision value from the memory in the decoder that is generated from a previous iteration preceding the current iteration, wherein the previously generated hard decision value was stored in the decoder from a previous decoding iteration,
generating an updated hard decision value indicative of an updated decoded value for the current iteration by adding the biasing hard decision value to the previously generated hard decision value of the previous iteration,
updating the previously generated hard decision value with the updated hard decision value as an intermediate decoded value of this iteration, and
transmitting data corresponding to the decoded codeword to a target application.

18. The method of claim 1 further comprising transmitting the decoded codeword to a user or application.

19. The method of claim 4 further comprising retrieving and reusing the LLR amplitude value and the updated hard decision value without engaging additional circuit power to generate a new hard decision value for power conservation in the decoder.

* * * * *